(12) United States Patent
Hiroki

(10) Patent No.: US 9,406,539 B2
(45) Date of Patent: Aug. 2, 2016

(54) SUBSTRATE TRANSFER APPARATUS

(71) Applicant: TOKYO ELECTRON LIMITED, Tokyo (JP)

(72) Inventor: Tsutomu Hiroki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 373 days.

(21) Appl. No.: 14/091,639

(22) Filed: Nov. 27, 2013

(65) Prior Publication Data
US 2014/0093336 A1 Apr. 3, 2014

Related U.S. Application Data

(63) Continuation of application No. 13/577,019, filed as application No. PCT/JP2011/000576 on Feb. 2, 2011, now abandoned.

(30) Foreign Application Priority Data

Feb. 5, 2010 (JP) ................................. 2010-024283

(51) Int. Cl.
*B25J 15/00* (2006.01)
*H01L 21/683* (2006.01)
*B65G 49/06* (2006.01)
*H01L 21/677* (2006.01)
*H01L 21/687* (2006.01)

(52) U.S. Cl.
CPC ............ *H01L 21/683* (2013.01); *B65G 49/061* (2013.01); *H01L 21/67742* (2013.01); *H01L 21/68707* (2013.01); *B65G 2249/045* (2013.01)

(58) Field of Classification Search
CPC ............... B25J 15/0014; B25J 15/0033; B25J 15/0038; B25J 15/0042
USPC ......... 414/217, 217.1; 294/213; 269/296–299
See application file for complete search history.

(56) References Cited

U.S. PATENT DOCUMENTS 5,722,646 A    3/1998  Soderberg et al.
5,984,293 A   11/1999  Abrahamson et al.
(Continued)

FOREIGN PATENT DOCUMENTS

JP       06278806      10/1994
JP      2000003951      1/2000
(Continued)

OTHER PUBLICATIONS

International Search Report—PCT/JP2011/000576 dated Mar. 8, 2011.

*Primary Examiner* — Jonathan Snelting
(74) *Attorney, Agent, or Firm* — Cantor Colburn LLP

(57) ABSTRACT

In the substrate holder, while holding a periphery portion of a semiconductor wafer, some of protruding portions having a grass shape on a pad main body hide beneath the semiconductor wafer, and the others of the protruding portions are exposed outside the semiconductor wafer. Also, the protruding portions hiding beneath the semiconductor wafer contact a rear surface of the semiconductor wafer, and sink the semiconductor wafer to a suitable depth via gravity, thereby holding the semiconductor wafer mainly in a length direction. In addition, some of protruding portions exposed near the periphery portion of the semiconductor wafer contact a side surface of the semiconductor wafer, thereby holding the semiconductor wafer mainly in a width direction.

12 Claims, 18 Drawing Sheets

(56) References Cited

U.S. PATENT DOCUMENTS

| | | |
|---|---|---|
| 6,056,026 A | 5/2000 | Fosnight et al. |
| 6,497,403 B2 | 12/2002 | Ries |
| 6,726,195 B1 | 4/2004 | Hertz et al. |
| 7,147,795 B2 | 12/2006 | Koeda et al. |
| 7,490,878 B1 | 2/2009 | Opansky et al. |
| 7,950,639 B2 | 5/2011 | Ladra et al. |
| 2002/0071756 A1 | 6/2002 | Gonzalez |
| 2004/0020789 A1 | 2/2004 | Hu et al. |
| 2005/0063800 A1 | 3/2005 | Kurita et al. |
| 2006/0291988 A1 | 12/2006 | Machiyama et al. |
| 2008/0181750 A1 | 7/2008 | Moriya et al. |

FOREIGN PATENT DOCUMENTS

| | | |
|---|---|---|
| JP | 2002064057 | 2/2002 |
| JP | 2003077980 | 3/2003 |
| JP | 2003168717 | 6/2003 |
| JP | 2009164226 | 7/2009 |
| JP | 2011026111 | 2/2011 |

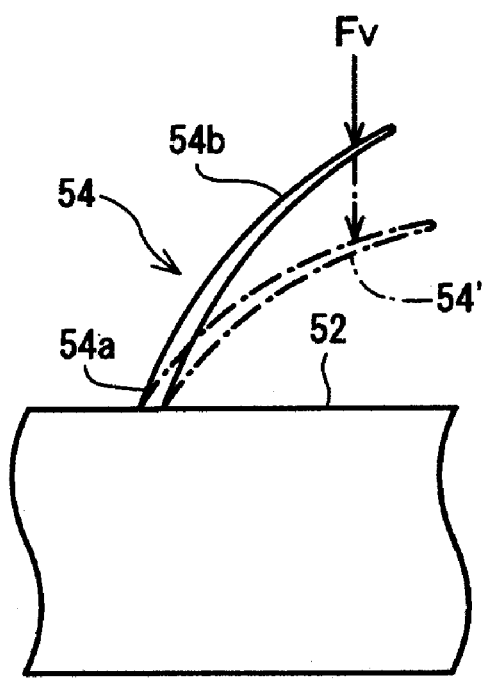

SUBSTRATE TRANSFER APPARATUS

CROSS-REFERENCE TO RELATED PATENT APPLICATIONS

This application is a continuation application of prior U.S. patent application Ser. No. 13/577,019, filed on Aug. 27, 2012, which is a national entry of International Application No. PCT/JP2011/000576, filed on Feb. 2, 2011, which claims a priority to and the benefit of Japanese Patent Application No. 2010-024283 filed on Feb. 5, 2010 in the Japan Patent Office, the disclosures of which are incorporated herein in its entirety by reference.

TECHNICAL FIELD

The present invention relates to a substrate holder for holding a target substrate on a transfer arm, and a single type substrate transfer apparatus and single type substrate processing apparatus using the substrate holder.

BACKGROUND ART

Today, a manufacture line of a semiconductor device or flat panel display (FPD) employs a single type process for processing target substrates (semiconductor wafers, glass substrates, etc.) one by one. Specifically, recently, in order to promote consistency, connectivity, or complexity of processes, a multi single type inline process system where a plurality of process units are integrally arranged along or around a transfer path of a transfer system is being widely used.

Such a transfer system for a single type process unit or for a multi single type inline process system uses a single type substrate transfer apparatus which holds substrates one by one, and carries the substrates into or out of each process unit one by one. Generally, such a type of substrate transfer apparatus is configured as a transfer robot, and includes one or several transfer arms capable of holding substrates to face upward one by one and performing rotating motion, elevating movement, and advancing and retreating movement.

The transfer arm of such a substrate transfer apparatus includes a substrate holding portion (holder or holding mechanism) that prevents a substrate from being misaligned or from falling during transfer. For such a conventional type of substrate holding portion, a rear surface friction method, a taper pad method, a dropping method, or a vacuum adhesion method is used.

In the rear surface friction method, a plurality of holding pads having a plate or block shape are discretely attached to a top surface or holding surface of the transfer arm. Then, the substrate is placed on the holding pad to face upward, and is held by using a frictional force between a rear surface of the substrate and a pad surface (for example, refer to FIG. 8 and descriptions thereof in Patent Reference 1). Elastomer, ceramic, or the like is used as a material of such a holding pad.

In the taper pad method, a plurality of holding pads having a tapered side surface (having a trapezoid longitudinal section) are discretely attached to a holding surface of the transfer arm at predetermined intervals such as to surround the substrate. Then, a periphery portion of the substrate is fastened to the tapered side surface of the holding pads such that the substrate is held facing upward (for example, refer to FIG. 4 and descriptions thereof in Patent Reference 1). According to this method, the substrate is dropped along the tapered side surface from a location higher than a top surface of the holding pad, above the holding surface of the transfer arm, and thus the substrate is held in line-contact to a location on the tapered side surface where gravity of the substrate and a reaction from the holding pad are balanced.

In the dropping method, a pick portion of the transfer arm is formed as a fork slightly larger than an outline shape of the substrate along the outline shape of the substrate, and a plurality of claw portions protruding from and extending inward the fork to surround the substrate at predetermined intervals adhere to the fork. Then, the substrate is dropped down to a bottom surface (holding surface) of the claw portions along an inclined surface formed on an inner side of the claw portions, so as to hold the substrate facing upward in surface-contact at the bottom surface of the claw portion (for example, refer to FIG. 4 and descriptions thereof in Patent Reference 2).

In the vacuum adsorption method, a plurality of suction holes are provided on a holding surface of the transfer arm, a rear surface of the substrate is placed on the suction holes, and a vacuum suction apparatus connected to the suction holes through an air passage performs vacuum suction, thereby fixing the substrate to the transfer arm at the suction holes (for example, refer to FIG. 3 and descriptions thereof in Patent Reference 2).

PRIOR ART REFERENCE

Patent Reference (Patent Reference 1) Japanese Laid-Open Patent Publication No. 2000-3951
(Patent Reference 2) Japanese Laid-Open Patent Publication No. 2002-64057

DISCLOSURE OF THE INVENTION

Technical Problem

In a manufacture line of a semiconductor device or an FPD, a substrate transfer technology is important in increasing production efficiency, and a transfer speed of a substrate transfer apparatus is making steady progress. Specifically, in a single type substrate transfer apparatus used in a multi single type inline process system, an operation of a transfer arm which holds a substrate is speeding up by not only including a slide movement and an elevating movement, but also a rotating motion. Meanwhile, it is easy for a leading end portion of the transfer arm to tilt forward due to gravity of the substrate, according to an increased size of the substrate.

Under such a technical background, performance or functionality of a substrate holding portion for holding a substrate on a transfer arm while the substrate faces upward has become an important technical factor that affects not only transfer capability of a substrate transfer apparatus but also throughput of a substrate processing apparatus or process system.

In this regard, according to the rear friction method above, since the substrate is held only by using the frictional force between the rear surface of the substrate and the pad surface, a substrate holding force is essentially weak, and thus the substrate may slide and fall from the transfer arm. Also, the coefficient of friction, i.e., a holding force, varies according to a rear surface state of the substrate, and it is difficult to hold the substrate when the substrate is bent.

Meanwhile, according to the taper pad method or dropping method, if a location of the substrate is misaligned when the substrate is placed on the transfer arm, the substrate may be placed on the pad or claw portion and easily tilt askew. When the substrate tilts askew on the transfer arm, it is easy for the substrate to fall, and even if the substrate does not fall, it is difficult to detect the location of the substrate on the transfer arm by using an optical sensor. As a result, it is difficult to adjust a location when the substrate is transferred from the transfer arm to another substrate supporting unit (for example, a substrate holding stage in a process unit).

Also, the taper pad method requires the suitable coefficient of friction between the tapered side surface of the holding pad and the substrate, and thus often uses elastomer as the material of the holding pad. However, regarding transfer of the substrate under a high temperature process, such as chemical vapor deposition (CVD), since a heat resistant temperature of elastomer is low (about 300° C.), ceramic is used as a material of the holding pad. However, also applied to the rear surface friction method, when a contact type holding pad is made of ceramic, the substrate easily slides, and thus stable holding is difficult.

The vacuum adsorption method does not cause any problem in terms of a substrate holding force, but is practically disadvantageous since a structure of the transfer arm and equipment of the substrate transfer apparatus are complicated and highly priced. Also, the vacuum adsorption method has a limitation in use since it does not function in a vacuum transfer apparatus which operates under decompression. Further, particles are easily adhered.

In order to overcome such problems of the prior art, the present invention provides a substrate holder which is simply adhered to a transfer body, such as a transfer arm, at a low price without any special work, is not affected by a rear surface state or bending of a substrate, and is capable of stably holding the substrate at a proper position, even when a location of the substrate is somewhat misaligned on a holding surface of the transfer body, and a single type substrate transfer apparatus and substrate processing apparatus using the substrate holder.

Technical Solution

According to an aspect of the present invention, there is provided a substrate holder which is attached to a holding surface of a transfer body for transferring a target substrate, and holds the substrate by contacting a periphery portion of the substrate, the substrate holder including: a pad main body which has a plate or block shape and is fixed to the holding surface of the transfer body; and a plurality of protruding portions which extend from the pad main body and are elastically transformable, wherein some of the plurality of protruding portions hold a rear surface of the substrate, and others of the protruding portions hold a side surface of the substrate.

According to another aspect of the present invention, there is provided a substrate holder which is attached to a holding surface of a transfer body for transferring a target substrate by placing the target substrate to face upward, and holds the substrate by contacting a periphery portion of the substrate, the substrate holder including: a pad main body which has a plate or block shape and is fixed to a holding surface of the transfer body; and a plurality of protruding portions which extend upward from a top surface of the pad main body, and are elastically transformable, wherein some of the plurality of protruding portions hold the substrate mainly in a direction perpendicular to a plate surface of the substrate by contacting a rear surface of the substrate, and others of the protruding portions hold the substrate mainly in a direction parallel to the plate surface of the substrate by contacting a side surface of the substrate.

In the substrate holder of the present invention, while holding the periphery portion of the target substrate on the holding surface of the transfer body, the protruding portions hiding beneath the substrate hold the rear surface of the substrate, and some of protruding portions exposed near the periphery portion of the substrate hold side surface of the substrate. By setting shape, sizes, arrangement density, and elastic forces of the protruding portions as parameters, a substrate holding force in each of a length direction and a width direction may be arbitrarily adjusted.

According to another aspect of the present invention, there is provided a substrate transfer apparatus which transfers a target substrate, the substrate transfer apparatus including: a transfer base portion which is configured to be moveable inside a chamber under atmospheric pressure or decompression; a transfer arm which is configured to be loaded on the transfer base portion and to support the substrate by placing the substrate on the transfer arm; an arm driving portion for moving the transfer arm on the transfer base portion in a predetermined direction; and a substrate holding portion which is attached to the transfer arm to hold the substrate, and including the substrate holder above.

According to another aspect of the present invention, there is provided a substrate processing apparatus including: a single type process unit which performs a predetermined process on a target substrate under atmospheric pressure or decompression; and a substrate transfer mechanism which includes a transfer arm to which the substrate holder above is attached, places the substrate on the transfer arm, and transfers the substrate to carry the substrate into or out of the process unit.

Advantageous Effects

According to the above structures and effects, a substrate holder of the present invention can be simply attached to a transfer body, such as a transfer arm, at a low price without any special work, is not affected by a rear surface state or bending of a substrate, and can stably hold the substrate at a proper position even when a location of the substrate is somewhat misaligned on a holding surface of the transfer body.

By using the substrate holder of the present invention, a substrate transfer apparatus of the present invention can arbitrarily and freely select an arm position, an arm moving trajectory, and a transfer speed while holding and transferring a substrate to a transfer arm without being limited by a substrate holding portion, thereby improving transfer capability.

By using the substrate holder of the present invention, a substrate processing apparatus of the present invention can improve transfer efficiency, thereby improving throughput.

BRIEF DESCRIPTION OF THE DRAWINGS

FIGS. 5A and 5B are side views schematically showing an operation of the substrate holder;

BEST MODE FOR CARRYING OUT THE INVENTION

Hereinafter, suitable embodiments of the present invention will be described with reference to accompanying drawings.

[Substrate Transfer Apparatus and Substrate Processing Apparatus According to Embodiments]

Figure 1:
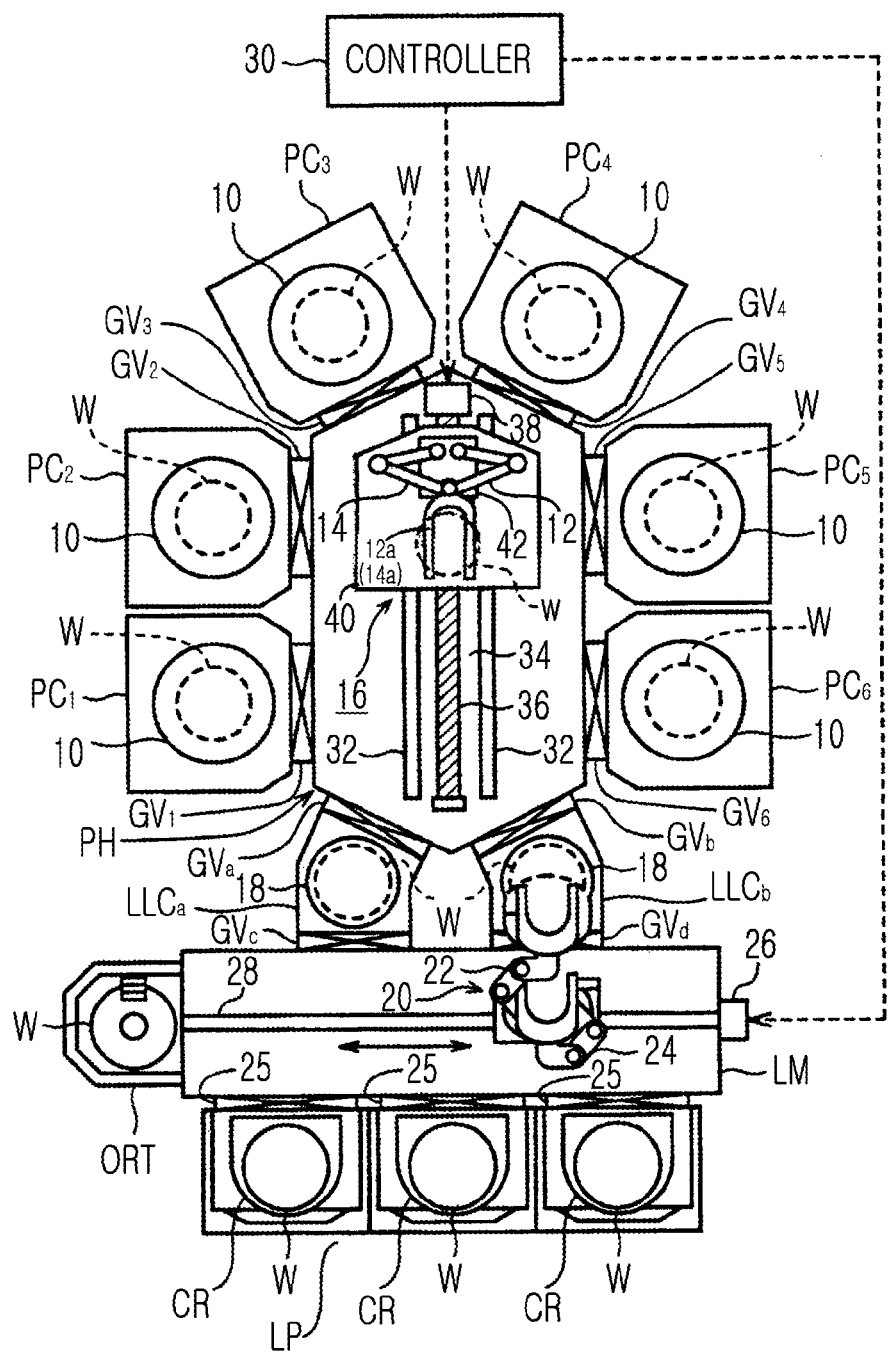
FIG. 1 is a plan view showing a structure of a substrate processing apparatus according to an embodiment of the present invention.
Figure 2:
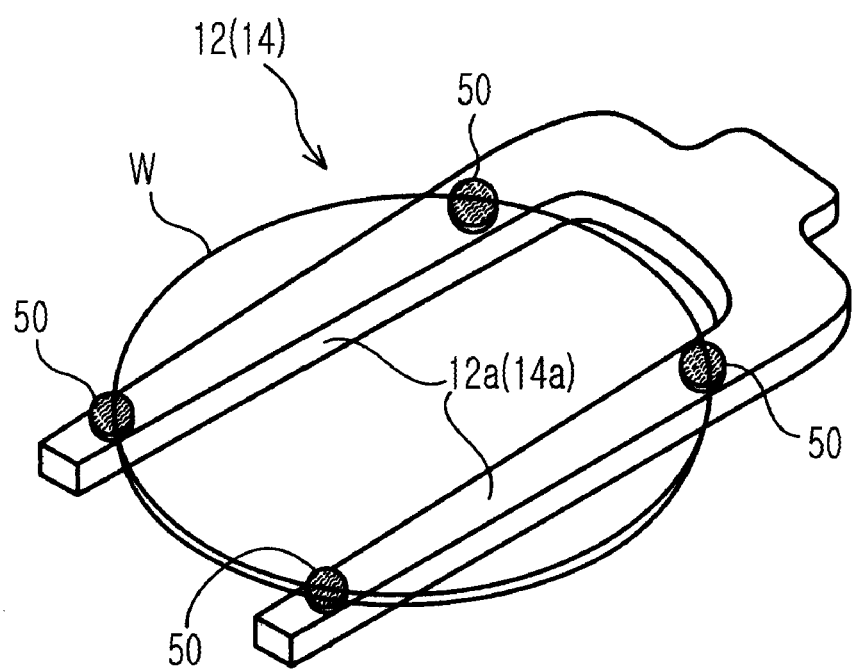
FIG. 2 is a perspective view showing an external structure of core elements of a transfer arm of a substrate transfer apparatus used in the substrate processing apparatus.

FIGS. 1 and 2 show a structure of a substrate processing apparatus, according to an embodiment of the present invention. The substrate processing apparatus is configured as a cluster tool type vacuum processing apparatus, which is a type of a multi single type inline process system.

The cluster tool type vacuum processing apparatus is provided in a clean room, and arranges six vacuum process chambers $PC_1$, $PC_2$, $PC_3$, $PC_4$, $PC_5$, and $PC_6$, and two load lock chambers $LLC_a$ and $LLC_b$ in a cluster shape around a vacuum platform (vacuum transfer chamber) PH having a hexagonal shape, wherein a pair of sides extending in an apparatus depth direction is about twice longer than other sides.

In more detail, in the platform PH, in a clockwise order on the drawing, two process chambers $PC_1$ and $PC_2$ are connected to a first long side through gate valves $GV_1$ and $GV_2$, process chambers $PC_3$ and $PC_4$ are respectively connected to first and second short sides through gate valves $GV_3$ and $GV_4$, two process chambers $PC_5$ and $PC_6$ are connected to a second long side through gate valves $GV_5$ and $GV_6$, and the load lock chambers $LLC_a$ and $LLC_b$ are respectively connected to third and fourth short sides through gate valves $GV_a$ and $GV_b$.

Each of the process chambers $PC_1$ through $PC_6$ is connected to an exclusive vacuum exhaust apparatus (not shown), and thus the interior of each chamber is always maintained in a decompressed state at a variable pressure. Generally, a target object, for example, a semiconductor wafer W, is placed on a holding stage 10 arranged at a center portion inside each chamber, and a required single type process, for example, a vacuum film forming process, such as CVD, atomic layer deposition (ALD), or sputter, a thermal process, a cleaning process of a semiconductor wafer surface, or a dry etching process, is performed by using a predetermined power (process gas, high frequency, or the like).

The platform PH is connected to an exclusive vacuum exhaust apparatus (not shown), and thus the interior of the platform PH is always maintained in a decompressed state generally at a constant pressure. A single type vacuum transfer robot (substrate transfer apparatus) 16 including a pair of stretchable transfer arms 12 and 14, and capable of performing a slide operation, a rotating operation, and an elevating operation, is provided in the platform PH.

Each of the load lock chambers $LLC_a$ and $LLC_b$ is connected to an exclusive vacuum exhaust apparatus (not shown) through an opening/closing valve, and thus the interior of each chamber may be frequently switched between an atmospheric pressure state and a vacuum state. The load lock chambers $LLC_a$ and $LLC_b$ are connected to a loader transfer chamber LM under an atmospheric pressure respectively through gate valves $GV_c$ and $GV_d$, from an opposite side viewed from the platform PH. A delivery stand 18 on which the semiconductor wafer W under retention is placed is provided at a center portion in each of the load lock chambers $LLC_a$ and $LLC_b$.

A load port LP and a location adjusting mechanism ORT are provided adjacent to the loader transfer chamber LM. The load port LP is used for inserting and discharging of a wafer cassette CR capable of accommodating, for example, twenty five semiconductor wafers W in one batch, between an external transfer vehicle. Here, the wafer cassette CR is configured as a front open unified pod (FOUP), a standard mechanical interface (SMIF) box, or the like. The location adjusting mechanism ORT is used to adjust a notch of the semiconductor wafer W or an orientation flat to a predetermined location or direction.

A single type atmosphere transfer robot (substrate transfer apparatus) 20 provided in the loader transfer chamber LM includes a pair of stretchable transfer arms 22 and 24 vertically overlapping in two stages, is capable of elevating and rotating as well as moving in a horizontal direction on a linear guide 28 of a linear motor 26, and transfers the semiconductor wafer W one by one (or in a batch unit) by moving among the load port LP, the location adjusting mechanism ORT, and the load lock chambers $LLC_a$ and $LLC_b$. The atmosphere transfer robot 20 carries the semiconductor wafer W into the loader transfer chamber LM while each LP door 25 provided on a front surface of the wafer cassette CR is opened. The linear guide 28 includes, for example, a magnet made of a permanent magnet, a driving magnetic coil, and a scale head, and controls a linear movement of the atmosphere transfer robot 20 according to a command from a controller 30.

Here, a basic wafer transfer sequence for performing a series of processes in this cluster tool on one wafer in the wafer cassette CR inserted into the load port LP is explained.

The atmosphere transfer robot 20 in the loader transfer chamber LM takes out one semiconductor wafer W from the wafer cassette CR on the load port LP, performs location adjustment by transferring the semiconductor wafer W to the location adjusting mechanism ORT, and then transfers the semiconductor wafer W to any one (for example, the load lock chamber $LLC_a$) of the load lock chambers $LLC_a$ and $LLC_b$. The load lock chamber $LLC_a$ at a transfer place receives the semiconductor wafer W in an atmospheric pressure state, is vacuum-sucked after receiving the semiconductor wafer W, and transfers the semiconductor wafer W to the vacuum transfer robot 16 of the platform PH in a decompression state.

The vacuum transfer robot 16 carries the semiconductor wafer W taken out from the load lock chamber $LLC_a$ into a first process chamber (for example, the process chamber $PC_1$), by using one of the transfer arms 12 and 14. In the process chamber $PC_1$, a single type process of a first operation is performed under predetermined process conditions (gas, pressure, power, time, etc), according to a predetermined recipe.

After the single type process of the first operation is ended, the vacuum transfer robot 16 carries the semiconductor wafer W out of the process chamber $PC_1$, and then carries the carried out semiconductor wafer W into a following second process chamber (for example, the process chamber $PC_2$). Also in the second process chamber $PC_2$, a single type process of a second operation is performed under predetermined process conditions according to a predetermined recipe.

After the single type process of the second operation is ended, the vacuum transfer robot 16 carries the semiconductor wafer W out of the second process chamber $PC_2$, and carries the carried out semiconductor wafer W into a third process chamber (for example, the process chamber $PC_3$) if there is a following operation, and transfers the carried out semiconductor wafer to one of the load lock chambers $LLC_a$ and $LLC_b$ if there is no following operation. When a process is performed in a process chamber (for example, the process chamber $PC_5$) after the third one, the semiconductor wafer W is carried into a process chamber (for example, the process chamber $PC_6$) at a following stage if there is a following operation, and is returned back to one of the load lock chambers $LLC_a$ and $LLC_b$ if there is no following operation.

The vacuum transfer robot 16 of the platform PH may be configured to perform a pick and place operation, where the pair of transfer arms 12 and 14 access each of the process chambers $PC_1$ through $PC_6$ or each of the load lock chambers $LLC_a$ and $LLC_b$ around the vacuum transfer robot 16, and are alternatively used to initially carry the semiconductor wafer W out of the module and then to carry another semiconductor wafer W into the module by replacing the semiconductor wafer W.

As described above, when the semiconductor wafer W on which the series of processes are performed in the plurality of process chambers $PC_1$, $PC_2$, and so on in the cluster tool is carried into one of the load lock chambers (for example, the load lock chamber $LLC_b$), a decompression state in the load lock chamber $LLC_b$ is switched to an atmospheric pressure state. Then, the atmosphere transfer robot 20 in the loader transfer chamber LM takes out the semiconductor wafer W from the load lock chamber $LLC_b$ in an atmospheric pressure state, and returns the semiconductor wafer W back to the corresponding wafer cassette CR. Also, heating or cooling process may be performed under a desired atmosphere on the semiconductor wafer W in the load lock chamber $LLC_a$ and $LLC_b$.

As described above, the cluster tool type vacuum processing apparatus is capable of continuously performing a series of vacuum processes inline on the semiconductor wafer W by sequentially transferring one semiconductor wafer W to a plurality of process chambers through the platform PH under decompression, and specifically in a vacuum film forming process, is capable of depositing desired thin films inline by continuously performing different film forming processes in a plurality of process chambers.

According to the cluster tool type vacuum processing apparatus, a pair of guide rails 32 and a transfer screw 36 of a ball thread mechanism 34 are built parallel to each other in a length direction of the platform PH inside the platform PH, and the vacuum transfer robot 16 is capable of sliding on the guide rail 32 according to a straight driving of the ball thread mechanism 34. In the ball thread mechanism 34, one end of the transfer screw 36 is combined to a motor 38.

The vacuum transfer robot 16 includes a transfer base portion 40 performing a slide operation, and an arm stretch driving portion 42 that moves pick portions 12a and 14a of the transfer arms 12 and 14 back and forth in a straight line or advances and retreats the pick portions 12a and 14a, in a direction parallel to a rotating radius. The arm stretch driving portion 42 stretches the transfer arms 12 and 14 formed of horizontal multi-joint robot, thereby performing a carry in and out or pick and place operation of the semiconductor wafer W as described above. Operations of each of the arm stretch driving portion 42, a rotating driving portion and an elevating driving portion in the transfer base portion 40, and the ball thread mechanism 34 (motor 38) are controlled by the controller 30.

Hereinafter, in the cluster tool type vacuum processing apparatus, a substrate holder according to an embodiment of the present invention applied to the transfer arms 12 and 14 of the vacuum transfer robot 16 will be described.

Each of the transfer arms 12 and 14 of the vacuum transfer robot 16 attaches a substrate holder (not shown in FIG. 1) of the present invention to it for stably holding the semiconductor wafer W, so that a rotating motion, an elevating movement, or an advancing and retreating movement is arbitrarily performed at a high speed while the semiconductor wafer W is placed facing upward.

In detail, as shown in FIG. 2, in the top or holding surface of the pick portion 12a (14a) having a fork shape of the transfer arm 12 (14), a plurality of (four in the shown example) substrate holders 50 according to the present invention are discretely attached to predetermined places, i.e., base portions and leading end portions of the pick portions 12a and 14a having a fork shape, so as to hold the periphery portion of the semiconductor wafer W at suitable intervals.

In the vacuum transfer robot 16, by attaching the substrate holder 50 of the present invention described below to each of the transfer arms 12 and 14, it is possible to arbitrarily and freely select an arm position, an arm moving trajectory, and a transfer speed when each of the transfer arms 12 and 14 holds and transfers the semiconductor wafer W without being restricted by a substrate holding portion, thereby improving transfer capability.

Also, as the transfer capability of the vacuum transfer robot 16 operated in the platform PH is improved, throughput of an entire system in the cluster tool type vacuum processing apparatus is improved.

[First Embodiment on Substrate Holder]

Figure 3:
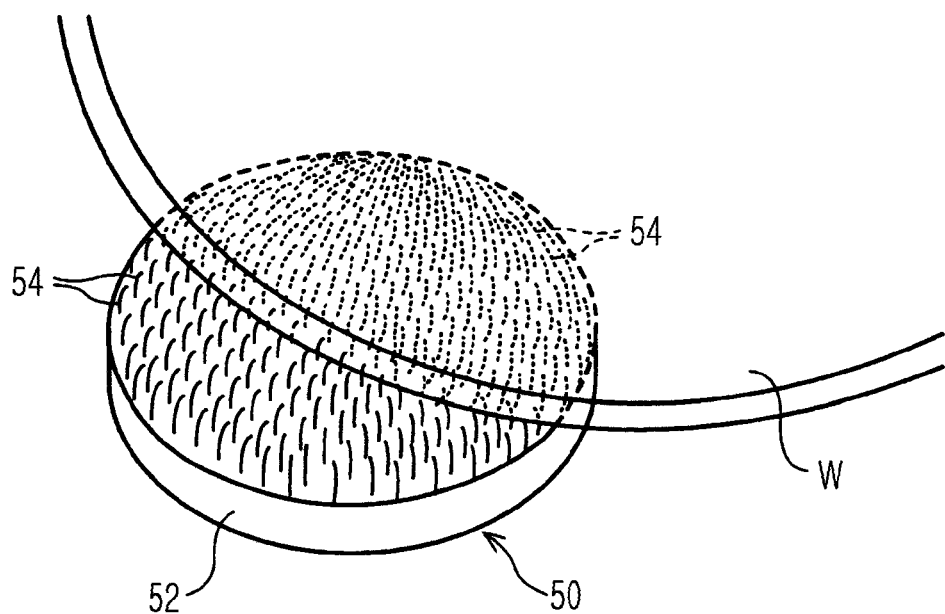
FIG. 3 is a perspective view schematically showing an external structure of a substrate holder according to a first embodiment.
Figure 4:
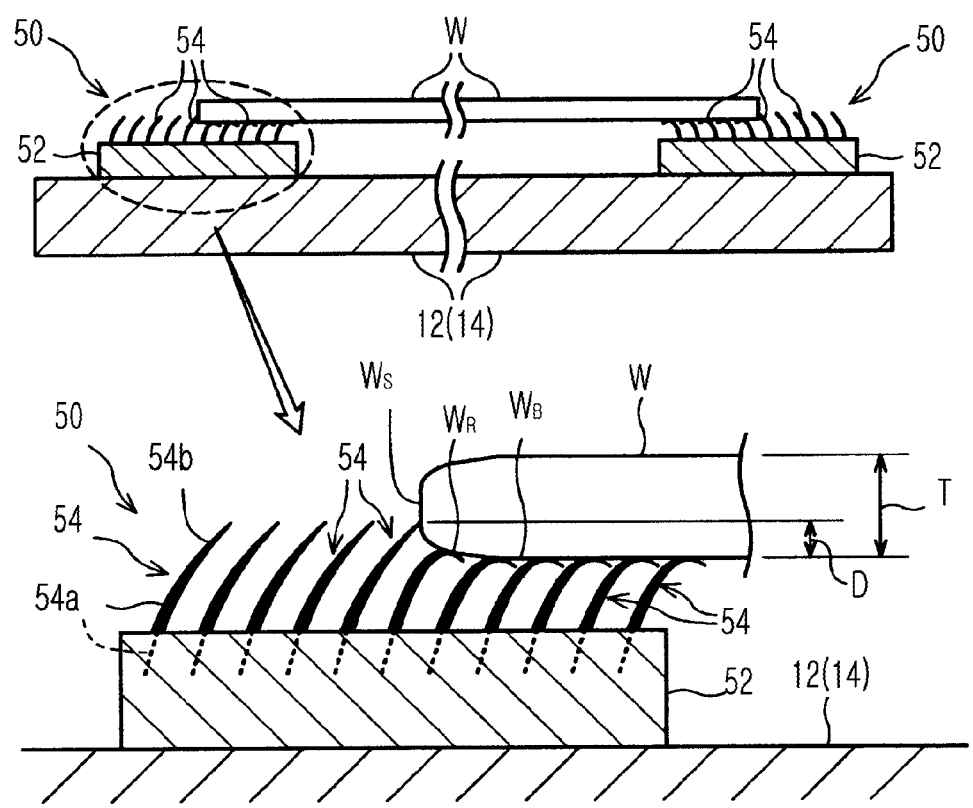
FIG. 4 is a side view schematically showing an operation of the substrate holder.
Figure 5B:
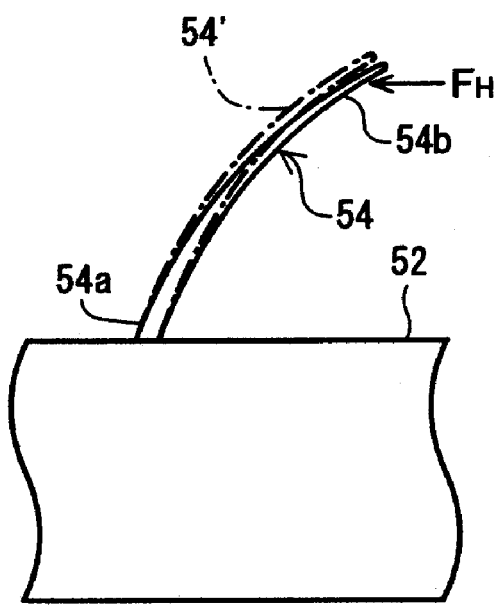
Figure 6:
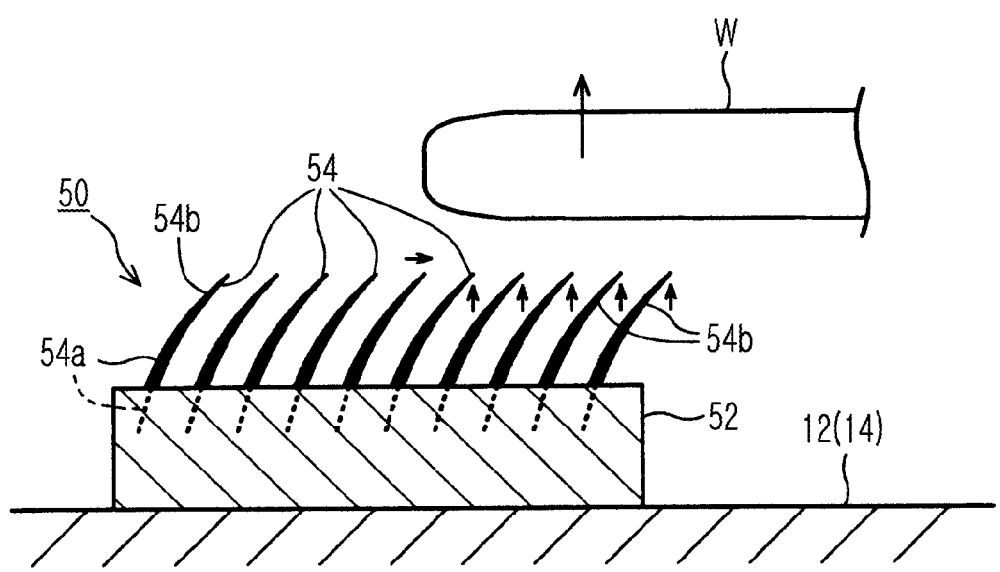
FIG. 6 is a side view schematically showing an operation of the substrate holder.

FIG. 3 shows an external structure of the substrate holder 50 according to a first embodiment of the present invention. FIGS. 4 through 6 show operations of the substrate holder 50.

The substrate holder 50 in the present embodiment includes a pad main body 52 fixed to the holding surface of the transfer arm 12 (14) via screw or adhesion, and a plurality of (preferably many or countless) grass shaped (specifically like a straight hair type artificial lawn) protruding portions 54.

As shown in FIGS. 2 and 3, the substrate holders 50 are provided at predetermined places of the transfer arm 12 (14) such that some of the grass shaped protruding portions 54 on the pad main body 52 hide beneath the semiconductor wafer W and others of the grass shaped protruding portion 54 are exposed outside the semiconductor wafer W when the substrate holders 50 hold the periphery portion of the semiconductor wafer W.

The pad main body 52 of the substrate holder 50 has a piece of plate shape (for example, a circular plate shape) or a block shape (for example, a cylindrical shape). A top surface of the pad main body 52 may be parallel to the holding surface of the transfer arm 12 (14). A material of the pad main body 52 may be a metal or ceramic, but alternatively, a resin, such as Teflon (registered mark) or PEEK (brand name), may be suitably used.

The grass shaped protruding portion 54 of the substrate holder 50 includes a base 54a fixed to the top surface of the pad main body 52, and a contact portion or free end 54b extending upward askew from the base 54a and capable of being elastically transformed or displaced according to external force or external energy (gravity, pressure, thermal energy, or the like from the semiconductor wafer W).

As a structure for fixing the base 54a of the protruding portion 54 to the pad main body 52, for example, as shown in FIG. 4, a method of burying and planting the base 54a in the pad main body 52 like a root of grass may be suitably employed. Alternatively, the protruding portion 54 may be integrally molded with the pad main body 52.

The contact portion 54b of the protruding portion 54, as shown in FIG. 4, may be long and thin like a leaf of grass and have a leading end portion in a tapered shape. The leading end portion may tilt askew (preferably at an angle from 30° to 60°) with respect to a direction crossing the holding surface of the transfer arm 12 (14) at right angles when the contact portion 54b does not contact the semiconductor wafer W, and may face inward of the outline of the semiconductor wafer W when the contact portion 54b contacts the semiconductor wafer W.

The protruding portions 54 may have suitable rigidity and elastic modulus since the protruding portions 54 are individually elastically transformable with respect to external force. Specifically, as an elastic function of the protruding portion 54, the protruding portion 54 may be easily bent (small elastic modulus) with respect to force $F_v$ in a vertical direction from the top as shown in FIG. 5A, while the protruding portion 54 may be difficult to be bent (high elastic modulus) with respect to a force $F_H$ in a horizontal direction from the side as shown in FIG. 5B. For example, the protruding portion 54 may have a thin leading portion to be easily bent with respect to the force $F_v$ in the vertical direction, and may have a thick base to be bent with difficulty with respect to the force $F_H$ in the horizontal direction.

A material of the protruding portion 54 may be an elastic body made of rubber and capable of elastic transformation in an arbitrary direction, and specifically be fluoro rubber having excellent thermal resistance and chemical resistance. Alternatively, resin capable of elastic transformation in a predetermined direction according to a shape, for example, Teflon (registered mark) or PEEK, may be suitably used.

In the substrate holder 50 according to the present embodiment, according to the elastic function of the protruding portion 54 described above, when the semiconductor wafer W on the transfer arm 12 (14) is placed on the substrate holder 50 at the periphery portion, the semiconductor wafer W sinks by a suitable depth on the grass shaped protruding portion 54 as shown in FIG. 4. The sunken amount D may be smaller than a thickness T of the semiconductor wafer W, and preferably about half of the thickness T (D=0.4 to 0.6T). Also, the thickness T is 0.8 mm in the semiconductor wafer W having a diameter of, for example, 300 mm. Considering insufficient bending or sinking of the semiconductor wafer W, the maximum value of the sunken amount may be about the thickness of the semiconductor wafer W.

Here, in the protruding portions 54 hiding beneath the semiconductor wafer W from among the grass shaped protruding portion 54 on the pad main body 52, each contact portion 54b contacts a rear surface $W_B$ of the semiconductor wafer W, and holds the semiconductor wafer W mainly in the length direction, i.e., in a direction perpendicular to the plate surface of the semiconductor wafer W (or the holding surfaces of the transfer arms 12 and 14), resistively to force (gravity) in the length direction from the semiconductor wafer W as the contact portion 54b bends downward as shown in FIG. 5A. Also, since the number of protruding portions 54 contacting the rear surface $W_B$ of the semiconductor wafer W is relatively high, and thus a contact area is large, holding force in the width direction by contact friction is somewhat obtained.

Some of the protruding portions 54 exposed near the periphery portion of the semiconductor wafer W from among the grass shaped protruding portions 54 on the pad main body 52 contact a side surface $W_S$ of the semiconductor wafer W, and hold the semiconductor wafer W mainly in a direction parallel to the plate surface of the semiconductor wafer W resistively to force (pressure) facing sideways from the semiconductor wafer W as the contact portion 54b is elastically transformed to retreat sideways a little as shown in FIG. 5B. Also, since the number of protruding portions 54 contacting the side surface $W_S$ of the semiconductor wafer W is relatively low, and thus a contact area is small, contact friction or reaction in the length direction is small.

Also, a rounding work is generally performed on the periphery portion of the semiconductor wafer W, and thus as shown in FIG. 4, some of the grass shaped protruding portions 54 may contact an peripheral round incline $W_R$. The grass shaped protruding portion 54 contacting the peripheral round incline $W_R$ of the semiconductor wafer W as such is located in the middle between the protruding portion 54 contacting the rear surface $W_B$ of the semiconductor wafer W and the protruding portion 54 contacting the side surface $W_S$ of the semiconductor wafer W, and holds the semiconductor wafer W in directions perpendicular and parallel to the plate surface of the semiconductor wafer W by taking a middle elastic transformation position. In this regard, the peripheral round incline $W_R$ of the semiconductor wafer W has a surface for both wafer side surface and wafer rear surface.

As shown in FIG. 6, when the semiconductor wafer W is separated relatively upward from the transfer arms 12 (14) so as to be transferred outside, the protruding portions 54 elastically transformed by contacting the semiconductor wafer W until then are returned back to original (no-load) state or original position according to elastic restoring force.

As described above, the substrate holder 50 of the present embodiment includes the pad main body 52 fixed to the holding surface of the transfer arm 12 (14), and the plurality of grass shaped protruding portion 54 provided on the top surface of the pad main body 52, where some of the grass shaped protruding portions 54 on the pad main body 52 hide beneath the semiconductor wafer W and others of the grass shaped protruding portions 54 are exposed outside the semiconductor wafer W, while holding the periphery portion of the semiconductor wafer W. Also, the protruding portions 54 hiding beneath the semiconductor wafer W contact the rear surface $W_B$ of the semiconductor wafer W and are transformed or displaced relatively largely downward by using a relatively small elastic modulus, so that the protruding portions 54 hold the semiconductor wafer W mainly in the length direction by sinking the semiconductor wafer W to a suitable depth via gravity. Also, some of the protruding portions 54 exposed near the periphery portion of the semiconductor wafer W contact the side surface $W_S$ of the semiconductor wafer W and are transformed a little to the width direction by using a high elastic modulus, thereby holding the semiconductor wafer W mainly in the width direction. Also, some of the protruding portions 54 that do not directly contact the side surface $W_S$ of the semiconductor wafer W support the protruding portions 54 contacting the side surface $W_S$ of the semiconductor wafer W from the back, and thus the number of the protruding portions 54 holding mainly the semiconductor wafer W in the width direction is never small. Thicknesses, heights, shapes, arrangement density, and elastic forces of the grass shaped protruding portions 54, a weight of the semiconductor wafer W, etc. may be set as parameters so as to arbitrarily adjust wafer holding force from each of the length and width directions.

The substrate holder 50 of the present embodiment stably and definitely holds the semiconductor wafer W facing upward on the transfer arm 12 (14) according to the above structures and operations.

In other words, since the substrate holder 50 elastically displaces the protruding portions 54 hiding beneath the semiconductor wafer W downward to sink the semiconductor wafer W in a horizontal position, even when a location of the semiconductor wafer W placed on the transfer arm 12 (14) is somewhat misaligned, the semiconductor wafer W does not tilt and is held by the substrate holder 50 in the horizontal position as long as the periphery portion of the semiconductor wafer W is placed on some of the grass shaped protruding portions 54 of each substrate holder 50.

In the width direction, since some of the protruding portions 54 mainly affect (contact) the side surface $W_S$ of the semiconductor wafer W to hold the semiconductor wafer W by elastic force, the coefficient of friction between the semiconductor wafer W and the protruding portion 54 is not important, and thus materials and shapes of the protruding portions 54 may be freely selected.

In the substrate holder 50 of the present embodiment, each grass shaped protruding portion 54 holds the semiconductor wafer W in the length direction by being transformed in the same direction when hiding beneath the semiconductor wafer W, and holds the semiconductor wafer W in the width direction without being transformed so much when contacting the wafer side surface from outside the semiconductor wafer W. Accordingly, even when a loading location of the semiconductor wafer W is somewhat misaligned, each grass shaped protruding portion 54 may flexibly deal with the misalignment.

Also, since the periphery portion of the semiconductor wafer W is sunken by a suitable depth via a self-weight on each substrate holder 50, even if the semiconductor wafer W is bent, the semiconductor wafer W is stably and definitely held as if there is no bending.

Also, even if the pick portion of the transfer arm 12 (14) is tilted forward during transfer, the substrate holder 50 can definitely stably hold the semiconductor wafer W. Specifically in a cluster tool processing apparatus, a transfer arm of a vacuum transfer apparatus is long and is easily tilted forward by a self-weight when the transfer arm is stretched while transferring a substrate to a process chamber, and thus it is a conventional problem that the substrate is easily misaligned on the arm. However, in the present embodiment, since the substrate holder 50 has sufficiently high holding force even in the width direction with respect to the semiconductor wafer W on the transfer arm 12 (14), location misalignment of the semiconductor wafer W can be prevented even when the transfer arm 12 (14) is tilted forward.

As such, the semiconductor wafer W is not tilted or misaligned on the transfer arm 12 (14). Accordingly, the semiconductor wafer W does not slide and fall, and precision and reliability of detecting the location of the semiconductor wafer W on the transfer arm 12 (14) by using an optical sensor are also improved.

Also, since the substrate holder 50 only contacts the periphery portion of the semiconductor wafer W, even when a rear surface state of the semiconductor wafer W is changed according to a process performed in a process chamber PC, the wafer holding force of the substrate holder 50 is not affected at all.

Also, the substrate holder 50 is detachable or freely and simply replaceable as a holding pad at a predetermined place of the holding surface of the transfer arm 12 (14), and is attached thereto at a low price. In the substrate transfer apparatus, a special process is not required in the transfer arm 12 (14), and a special control apparatus for turning on or off substrate holding is not necessary at all.

Modified Example of First Embodiment

In the first embodiment described above, it is possible to change a shape or thickness of the protruding portion 54 on the substrate holder 50. For example, an outer protruding portion 54 on which the semiconductor wafer W is not placed on the substrate holder 50 may be configured to be thick (strong) so as to definitely prevent misalignment of the semiconductor wafer W during transfer.

Also, in the first embodiment described above, the protruding portion 54 of the substrate holder 50 has a shape similar to straight hair type artificial lawn, but may alternatively have a shape similar to another artificial lawn. Alternatively, the protruding portion 54 may have a small thin piece shape, and for example, as shown in FIG. 7, a protruding portion 56 having a scale shape may be suitably employed.

Figure 7:
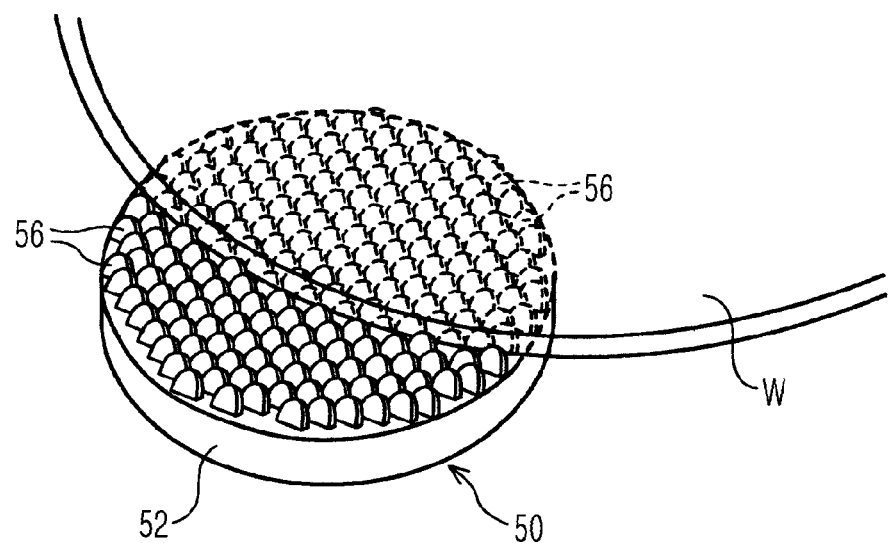
FIG. 7 is a perspective view schematically showing an external structure of a substrate holder according to a modified example of the first embodiment.

In FIG. 7, the scale shaped protruding portion 56 extends upward and askew from the top surface of the pad main body 52, and is elastically displaced according to an external force, i.e., gravity or pressure from the semiconductor wafer W, and thus may have the same operation as the grass shaped protruding portion 54 described above in holding the semiconductor wafer W.

In other words, while holding the periphery portion of the semiconductor wafer W, some of the scale shaped protruding portions 56 on the pad main body 52 hide beneath the semiconductor wafer W, and others of the scale shaped protruding portions 56 are exposed outside the semiconductor wafer W. Also, the protruding portions 56 hiding beneath the semiconductor wafer W contact the rear surface $W_B$ of the semiconductor wafer W to suitably sink the semiconductor wafer W in the horizontal position via gravity, thereby holding the semiconductor wafer W mainly in the length direction. Also, some of the protruding portions 56 exposed near the periphery portion of the semiconductor wafer W contact the side surface $W_S$ or the peripheral round incline $W_R$ of the semiconductor wafer W to be elastically displaced a little in the width direction with a high elastic modulus, thereby holding the semiconductor wafer W mainly in the width direction by preventing the semiconductor wafer W from being misaligned to sideways. Sizes, heights, arrangement density, and elastic forces of the scale shaped protruding portions 56, the weight of the semiconductor wafer W, etc. are set as parameters so as to arbitrarily adjust the wafer holding force in each of the length and width directions.

[Second Embodiment on Substrate Holder]

Next, a structure and operations of the substrate holder 50 according to a second embodiment of the present invention are described with reference to FIGS. 8 through 12.

Figure 8:
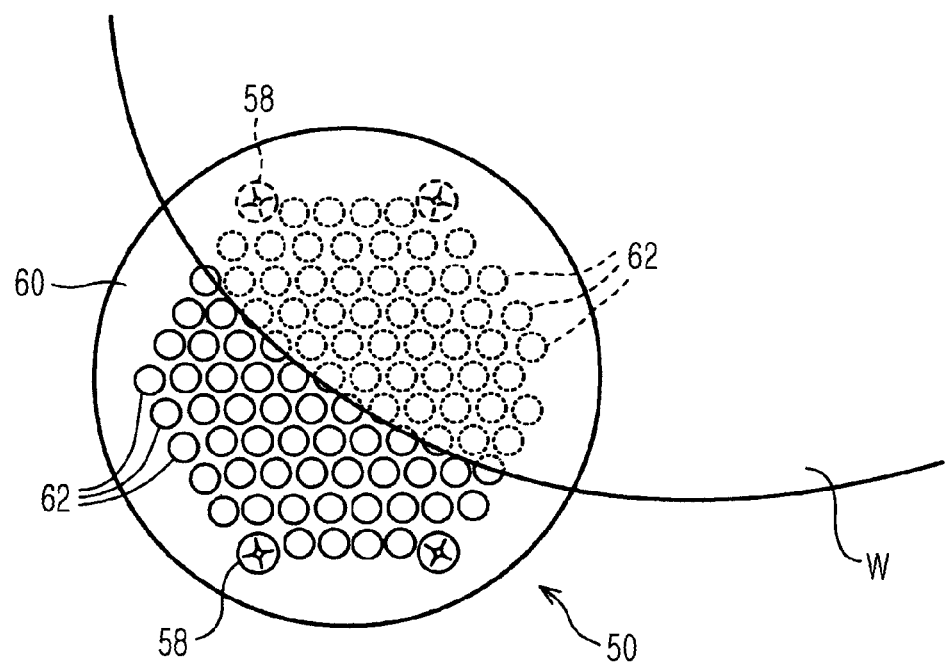
FIG. 8 is a plan view schematically showing an external structure of a substrate holder according to a second embodiment.
Figure 9:
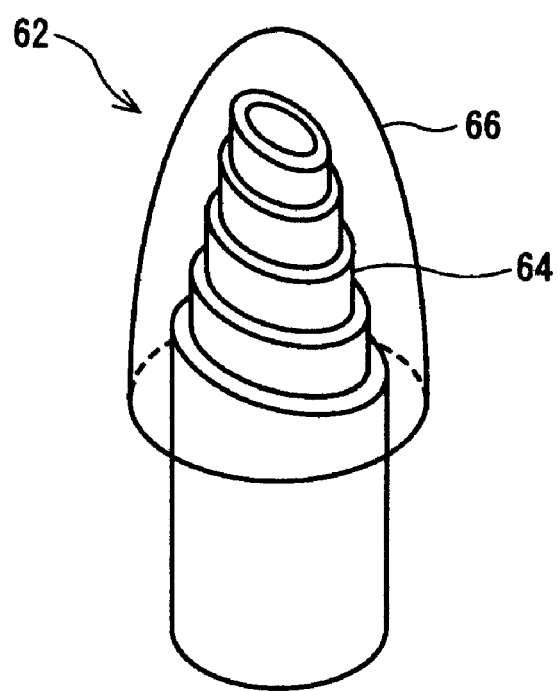
FIG. 9 is a perspective view showing a structure of a protruding portion of the substrate holder.
Figure 10:
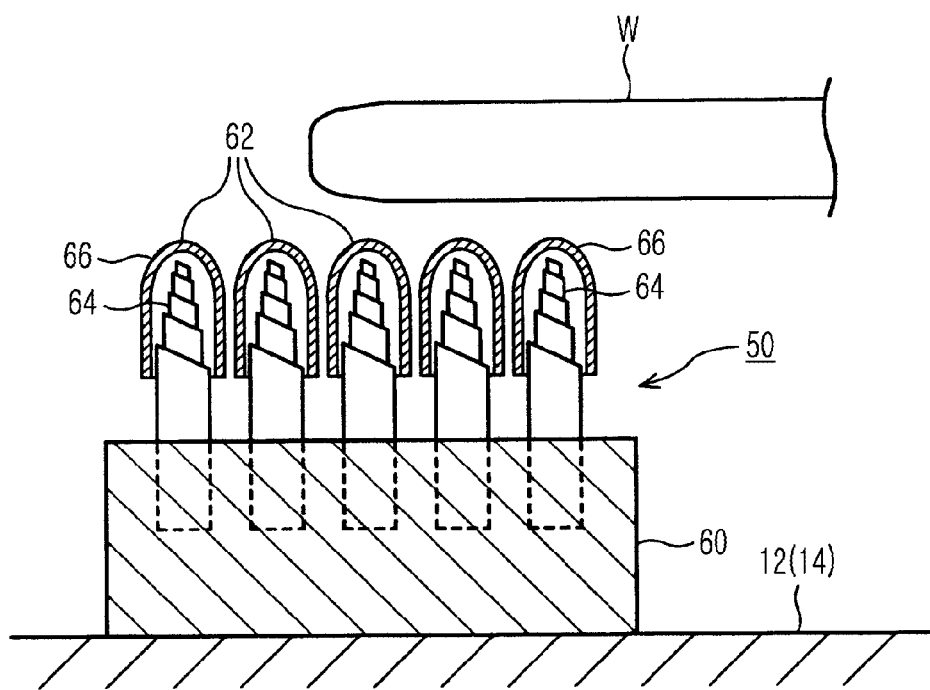
FIG. 10 is a partially cross-sectioned side view schematically showing a structure of the substrate holder.

The substrate holder 50 according to the second embodiment includes a pad main body 60 detachably fixed to the holding surface of the transfer arm 12 (14) by using, for example, a bolt 58 (FIG. 8), and a plurality of (preferably many) protruding portions 62 standing and provided close together at uniform density or pitches on a top surface of the pad main body 60, where each protruding portion 62 includes a spring member formed of a metal material, as shown in FIGS. 8 through 10.

In the protruding portion 62 of the substrate holder 50, for example, a volute spring is used as the spring member, where a cap 66 integrally covers a top portion of the volute spring 64 (FIG. 9). The volute spring 64 is provided on the top surface of the pad main body 60 to extend in a direction perpendicular to the holding surface of the transfer arm 12 (14), and a base portion of the volute spring 64 is buried in and fixed to the pad main body 60 (FIG. 10).

The pad main body 60 may have the same shape and be formed of the same material as the pad main body 52 of the first embodiment. The cap 66 may have a long container portion covering not only the top portion of the volute spring 64 but also a middle portion of the volute spring 64, and for example, a resin, such as Teflon (registered mark) or PEEK, may be suitably used as a material. The volute spring 64 may have a small size where an entire length is less than or equal to 1 cm, and may be any one of a product on the market and a custom-ordered product.

Figure 11:
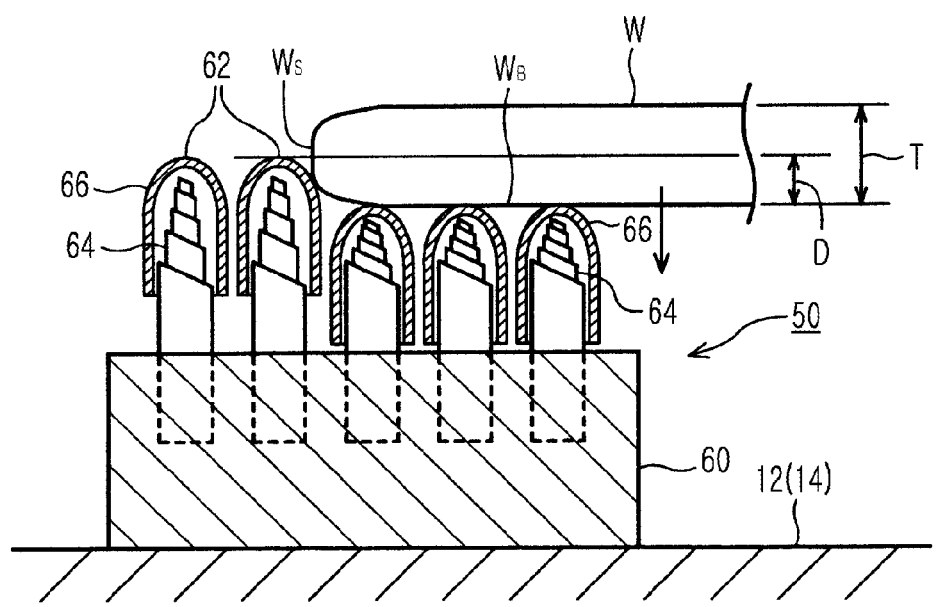
FIG. 11 is a side view schematically showing an operation of the substrate holder.
Figure 12:
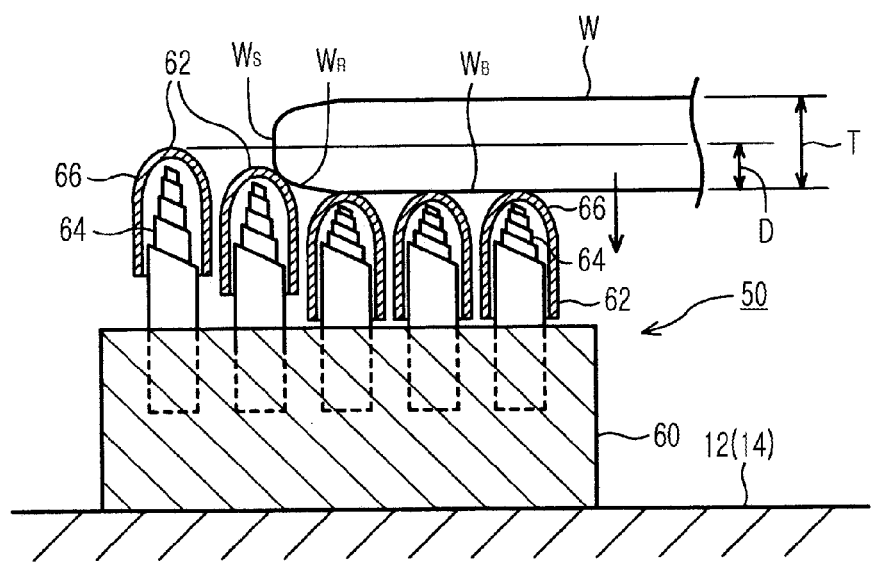
FIG. 12 is a side view schematically showing an operation of the substrate holder.

In the substrate holder 50 of the present embodiment, when the periphery portion of the semiconductor wafer W on the transfer arm 12 (14) is placed on the substrate holder 50, the semiconductor wafer W is sunken to a suitable depth on the spring-adhered protruding portions 62 as shown in FIG. 11 or 12. A sunken amount D may be smaller than the thickness T of the semiconductor wafer W, and is most preferably about a half of the thickness T (D=0.4 to 0.6T).

Here, protruding portions 62 hiding beneath the semiconductor wafer W from among the spring-adhered protruding portions 62 on the pad main body 60 contact the rear surface $W_B$ of the semiconductor wafer W at a apex portion of the cap 66, and hold the semiconductor wafer mainly in the length direction, i.e., in the direction perpendicular to the plate surface of the semiconductor wafer W (or the holding surfaces of the transfer arms 12 and 14) resistively to force (weight) in the length direction from the semiconductor wafer W as the volute spring 64 is compressed and transformed in an axis direction.

Also, some of the protruding portion 62 exposed near the periphery portion of the semiconductor wafer W from among the spring-adhered protruding portion 62 on the pad main body 60 contact the side surface $W_S$ or the peripheral round incline $W_R$ of the semiconductor wafer W at a portion lower than the apex portion of the cap 66, and hold the semiconductor wafer W mainly in the direction parallel to the plate surface of the semiconductor wafer resistively to force (pressure) facing sideways from the semiconductor wafer W.

Here, since the spring-adhered protruding portion 62 contacting the side surface $W_S$ of the semiconductor wafer W from a cylindrical shaped body portion of the cap 66 is scarcely affected by a weight in an axis direction, the volute spring 64 is scarcely (or a little) compressed and transformed (FIG. 11). Meanwhile, since the spring-adhered protruding portion 62 where a head portion of the cap 66 contacts the peripheral round incline $W_R$ of the semiconductor wafer W receives a weight in the axis direction, the volute spring 64 is a little compressed and transformed (FIG. 12).

As such, the substrate holder 50 according to the second embodiment includes the pad main body 60 fixed to the holding surface of the transfer arm 12 (14), and the plurality of spring-adhered protruding portions 62 standing and provided close together on the top surface of the pad main body 60, where some of the spring-adhered protruding portions 62 on the pad main body 60 hide beneath the semiconductor wafer W and others of the spring-adhered protruding portions 62 are exposed outside the semiconductor wafer W while holding the periphery portion of the semiconductor wafer W. Also, the spring-adhered protruding portion 62 hiding beneath the semiconductor wafer W contacts the rear surface $W_B$ of the semiconductor wafer W, and the volute spring 64 is compressed and transformed in the axis direction, thereby sinking the semiconductor wafer W by a suitable depth via gravity so as to hold the semiconductor wafer W mainly in the length direction. Also, some of the spring-adhered protruding portions 62 exposed near the periphery portion of the semiconductor wafer W contact the side surface $W_S$ or the peripheral round incline $W_R$ of the semiconductor wafer W, and the volute spring 64 is compressed and transformed scarcely or a little in the axis direction, and thus the semiconductor wafer W is held mainly in the width direction. Diameters, heights, cap shapes, arrangement density, and spring coefficients of the spring-adhered protruding portions 62, the weight of the semiconductor wafer W, etc. may be set as parameters to arbitrarily adjust the wafer holding force in each of the length and width directions.

For example, when the semiconductor wafer W has a diameter of 300 mm, the weight thereof is 130 g. In the vacuum transfer robot 16, assuming that a moving speed of the transfer arm 12 (14) is 0.5 m/sec and stops at 1 second, acceleration at the stop is 0.5 m/sec$^2$, and force in the width direction applied to the semiconductor wafer W is 130 g×0.5 m/sec$^2$=65 gm/sec$^2$. When the number of protruding portions 62 resisting against the force in the width direction from among the protruding portions 62 contacting the semiconductor wafer W (in the example of FIG. 2, the number of protruding portions 62 resisting against the force in the width direction with respect to two substrate holders 50 in an arm front portion) is, for example, 20, a load per one is about 3 gm/sec$^2$. Accordingly, the strength of the protruding portion 62 may be designed such as to endure the load of about 3 gm/sec$^2$ in the width direction.

In the length direction, the sunken amount of the semiconductor wafer W may be less than or equal to the thickness thereof (for example, 0.8 mm). In this case, when the number of protruding portions 62 receiving the weight of the semiconductor wafer W (in the example of FIG. 2, the number of protruding portions 62 receiving the weight of the semiconductor wafer W with respect to the four substrate holders 50 at arm front and rear portions) is 240, a load per one is 130 g/240=about 0.5 g/one. Accordingly, in the length direction, an elastic characteristic of the protruding portion 62 may be designed such that the protruding portion 62 is definitely transformed or displaced downward by the sunken amount less than or equal to 0.8 mm with respect to the load of about 0.5 g.

The strength in the width direction and the elastic characteristic in the length direction with respect to the protruding portion 62 described above are equally applied to the protruding portion 54 according to the first embodiment.

The substrate holder 50 of the second embodiment is capable of showing the same operation as the substrate holder of the first embodiment, is detachably and simply attached to the transfer arm 12 (14) at a low price without any special work, is not affected by the rear surface state or bending of the semiconductor wafer W, and stably holds the substrate at a proper position even if a holding location of the semiconductor wafer W on the holding surface of the transfer arm 12 (14) is somewhat misaligned.

Furthermore, in the substrate holder 50 of the second embodiment, since elastic displacement of the protruding portion 62 is performed by a spring made of a metal material, the substrate holder 50 has high advantages in realization, stability, and durability of substrate holding.

Also, when the substrate holder 50 of the second embodiment is formed of metal or ceramic, the substrate holder 50 has advantages of maintaining a holding force of a substrate while having high thermal resistance. Also, considering metal contamination, the substrate holder 50 may be formed of a softer material than a semiconductor wafer, for example, thermal resistant plastic.

Also, in order to remove charges of the semiconductor wafer W, the protruding portions 62 of the substrate holder 50 may be grounded. Accordingly, a spark may be prevented from being generated between the semiconductor wafer W charged after a plasma process, and an element in the processing apparatus.

First Modified Example of Second Embodiment

Figure 13:
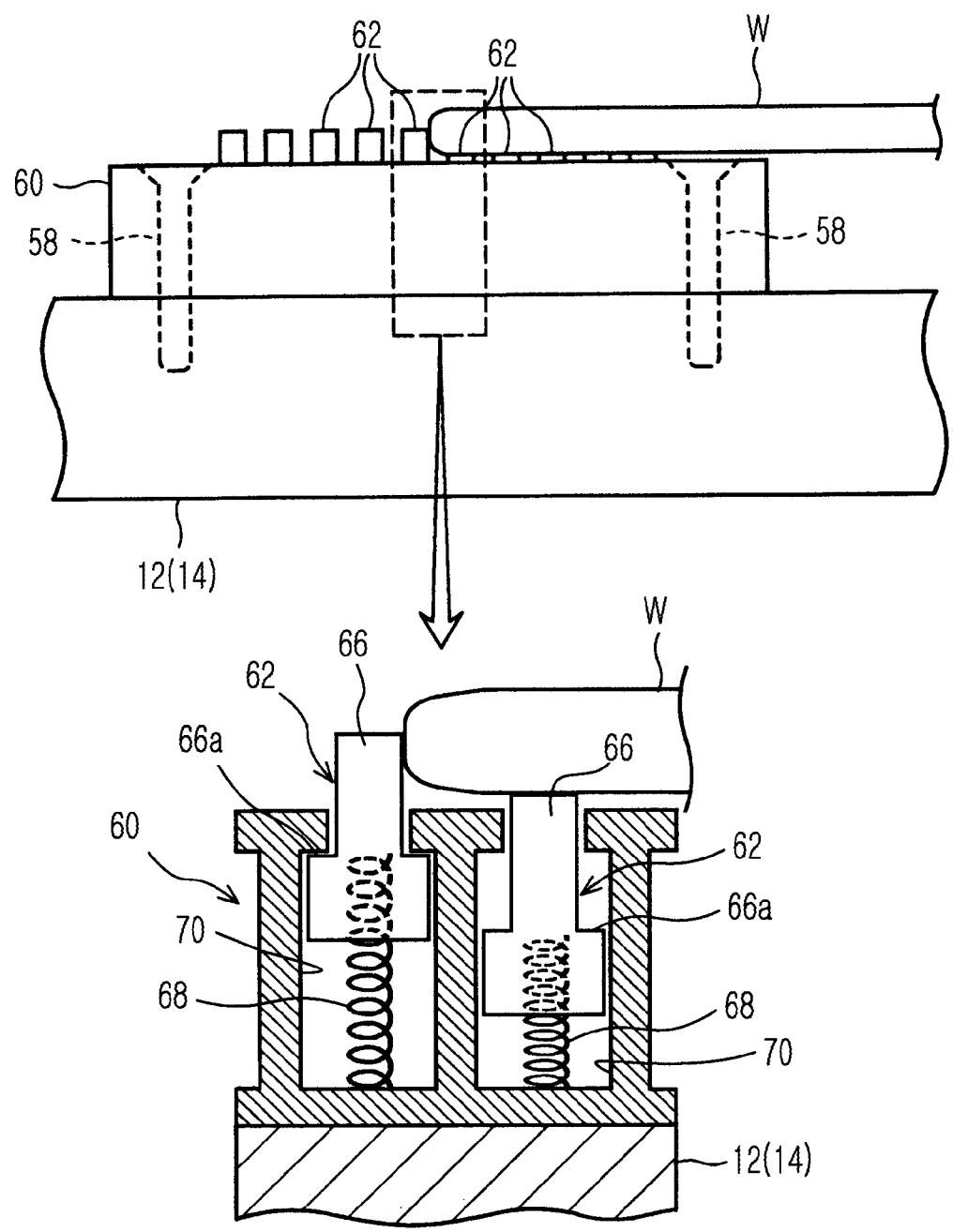
FIG. 13 is a view (side view and partially magnified cross-sectional view) showing a structure of a substrate holder according to a first modified example of the second embodiment.

In the substrate holder 50 of the second embodiment, the spring of the protruding portion 62 is not limited to the volute spring, and for example, as shown in FIG. 13, a compressed coil spring 68 may also be used.

The compressed coil spring 68 is accommodated in a counterbore hole 70 formed in the length direction on the top surface of the pad main body 60, and elastically transforms in the length direction with respect to weight or pressure applied form the semiconductor wafer W, i.e., in the direction perpendicular to the holding surface of the transfer arm 12 (14). A bottom of the compressed coil spring 68 is fixed to a bottom of the counterbore hole 70, and the cap 66 having a cylindrical shape covers a top portion of the compressed coil spring 68. An inner wall of the counterbore hole 70 includes a container shape guide portion for guiding the cap 66 in the length direction, and a stopper for defining an uppermost location of a shoulder portion 66a (further, the apex portion) of the cap 66.

Second Modified Example of Second Embodiment

Figure 14:
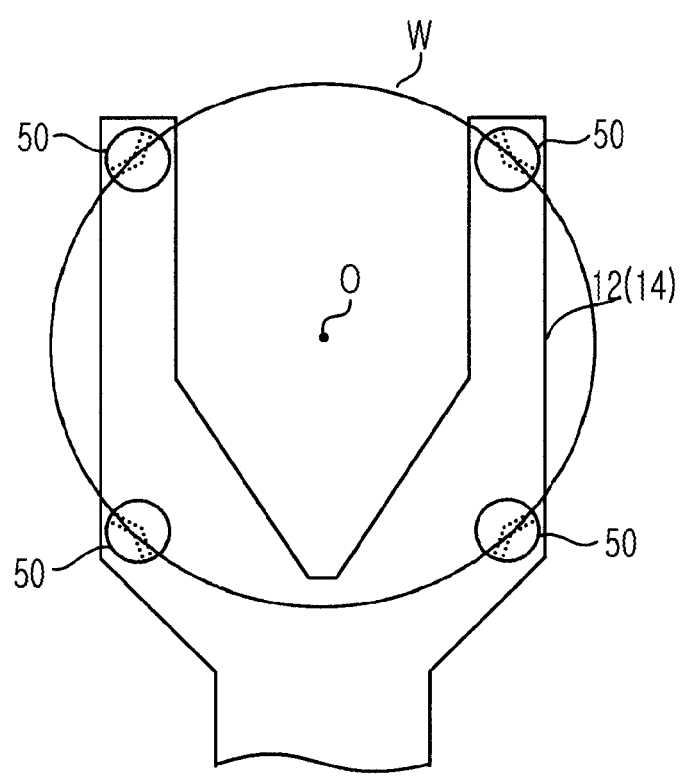
FIG. 14 is a plan view schematically showing an external structure of a substrate holder according to a second modified example of the second embodiment.

Next, a second modified example of the second embodiment including the spring-adhered protruding portion 62 is described with reference to FIGS. 14 through 16. FIG. 14 shows an external structure of the substrate holder 50 in the second modified example, and FIG. 15 is a magnified view thereof.

Like the first modified example (FIG. 13) described above, the substrate holder 50 in the second modified example also includes the pad main body 60 detachably fixed to the top surface of the transfer arm 12 (14), for example, by using the bolt 58, and the plurality of (preferably many) protruding portions 62 capable of being elastically displaced and accommodated in the counterbore hole 70 on the top surface of the pad main body 60, where each protruding portion 62 includes the spring member. A main difference from the first modified example is that the number of protruding portions 62 is largely reduced and an arrangement pattern of the protruding portions 62 are intently considered.

Figure 15:
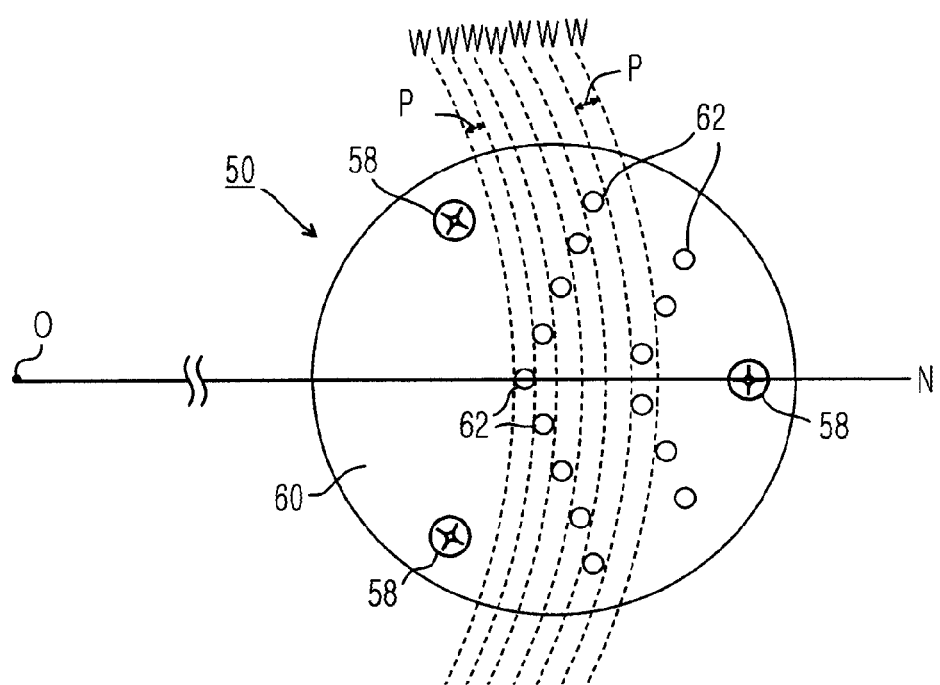
FIG. 15 is a magnified plan view showing the external structure of the substrate holder according to the second modified example.

In more detail, as shown in FIG. 15, the total number of protruding portions 62 provided on a top surface of the pad main body 60 is reduced to, for example, less than or equal to 10, and arrangement density is reduced, thereby reducing spring power of the protruding portion 62 receiving the weight of the semiconductor wafer W. Accordingly, the semiconductor wafer W can be further definitely sunken. Also, as shown in FIG. 16, for example, the sunken amount D may be equal to the thickness T of the semiconductor wafer W. By increasing the sunken amount D as such, sufficiently stable wafer holding force may be obtained even if the bending or sinking is not sufficient in the semiconductor wafer W.

Also, as shown in FIG. 15, the plurality of protruding portions 62 are arranged at regular intervals on a V-shaped line, where a peak in an axial symmetric to a straight line N passing through a center point O of the holding surface of the entire arm (or the center point at a reference wafer holding location) and a center of the pad main body 60 faces the center point O, and a V pattern is provided in a plurality of rows (two rows in the shown example) along the straight line N. According to such a protruding portion arrangement pattern, the side surface of the semiconductor wafer W is efficiently and stably held by one protruding portion 62 on the straight line N or a pair of protruding portions 62 on two sides of the straight line N according to constant pitches p (for example, p=0.2 mm) with respect to the location misalignment of the semiconductor wafer W, and all protruding portions 62 constituting the basis of the semiconductor wafer W may be sunken to a definitely sufficient depth.

The present embodiment includes other several features. For example, as shown in FIG. 16, the pad main body 60 is attached in a recess portion 72 formed on the top surface of the transfer arm 12 (14), and accordingly, the transfer arm 12 (14) including the substrate holder 50 is thinned.

It is possible to integrally form the pad main body 60 with the transfer arm 12 (14). Accordingly, by reducing the number of parts, a cleaning operation of the transfer arm 12 (14) may be easily performed.

Figure 16:
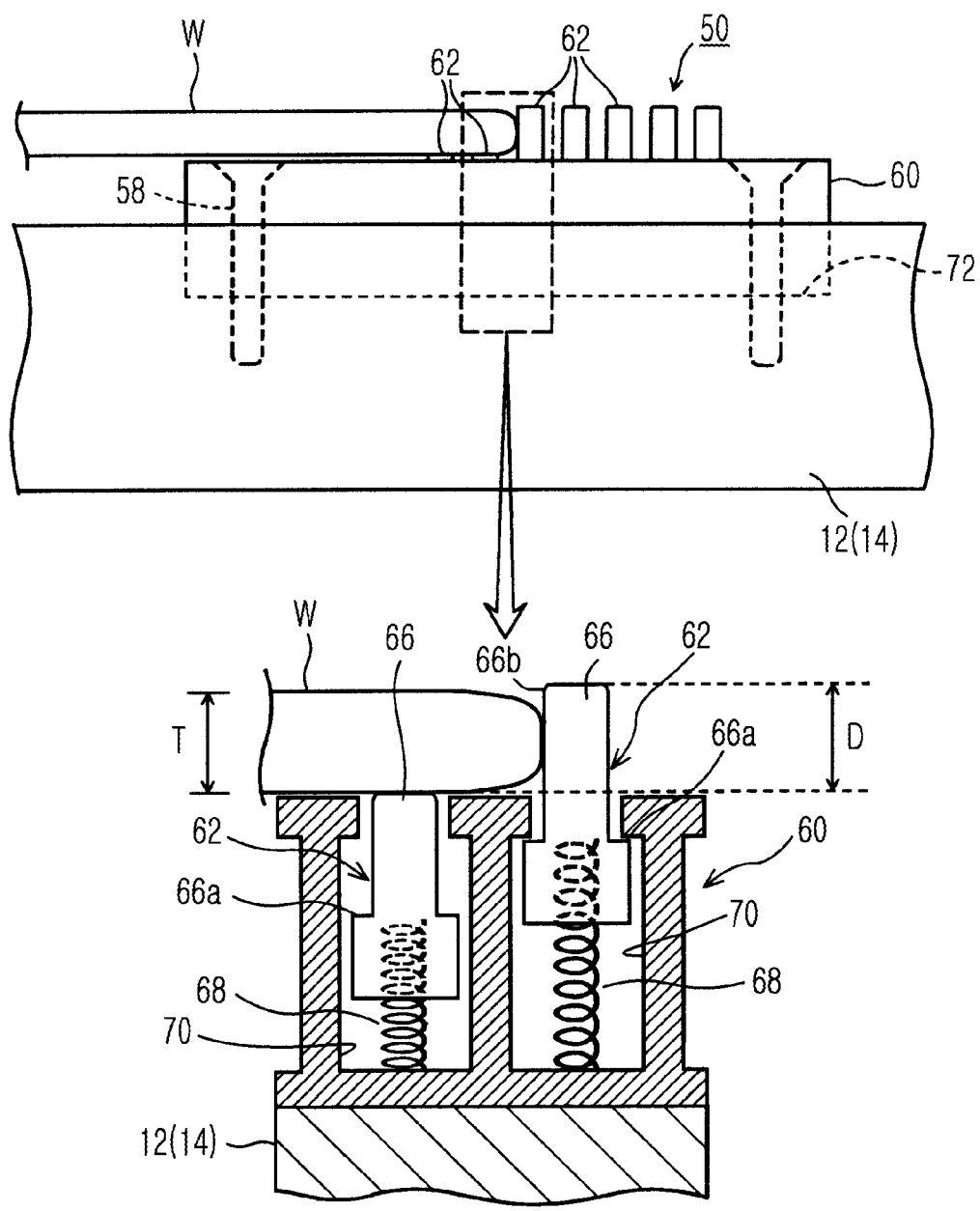
FIG. 16 is a view (side view and partially magnified cross-sectional view) showing the structure of the substrate holder according to the second modified example.

Also, in order not to damage the rear surface of the semiconductor wafer W on the substrate holder 50, a chamfering operation or an R operation 66b may be suitably performed on the apex portion of the cap 66 of the protruding portion 62 as shown in FIG. 16. Alternatively, although not shown, a structure with rotatably burying a rigid ball in the apex portion of the cap 66 such that only a top portion thereof is exposed (ball joint) may be employed.

Also, as shown in FIG. 16, the protruding portions 62 that are sunken after the semiconductor wafer W is placed thereon may not be completely sunken in the pad main body 60 (i.e., the apex portion of the cap 66 may stick up a little). Also, in order for the cap 66 to be displaced in the width direction, side clearance in the counterbore hole 70 of the pad main body 60 may be suitably increased. Thus, according to motion of the semiconductor wafer W, the protruding portions 62 holding the semiconductor wafer W also move together to the side, thereby further improving the holding force in the width direction with respect to the semiconductor wafer W.

Regarding a material of the substrate holder 50, a metal is preferable in terms of durability, resin (specifically, Teflon (registered trademark) or PEEK (brand name)) is preferable in terms of chemical resistance, and ceramic (silicon carbide or alumina), quartz, polyimide, or carbon is preferable in terms of thermal resistance. Specifically, according to ceramic or carbon, a ceramic spring or a carbon spring is used so as to form all parts or elements of the substrate holder 50 from a ceramic or carbon material.

Another Embodiment or Modified Example

While the present invention has been particularly shown and described with reference to exemplary embodiments thereof, it will be understood by those skilled in the art that various changes in form and details may be made therein without departing from the spirit and scope of the invention as defined by the appended claims.

For example, in the cluster tool type vacuum processing apparatus according to the above embodiment (FIG. 1), the substrate holder 50 of the above embodiment may be applied to the transfer arms 22 and 24 of the single type atmosphere transfer robot (substrate transfer robot) 20 provided in the loader transfer chamber LM.

Also, a target substrate in the present invention is not limited to a semiconductor wafer, and may be any one of various substrates for FPD (specifically organic EL and liquid crystal panel), a photo mask, a print substrate, etc. Accordingly, for example, as shown in FIG. 17, the substrate holder 50 of the above embodiment may be attached to a transfer arm 74 of a substrate transfer apparatus for FPD.

Figure 17:
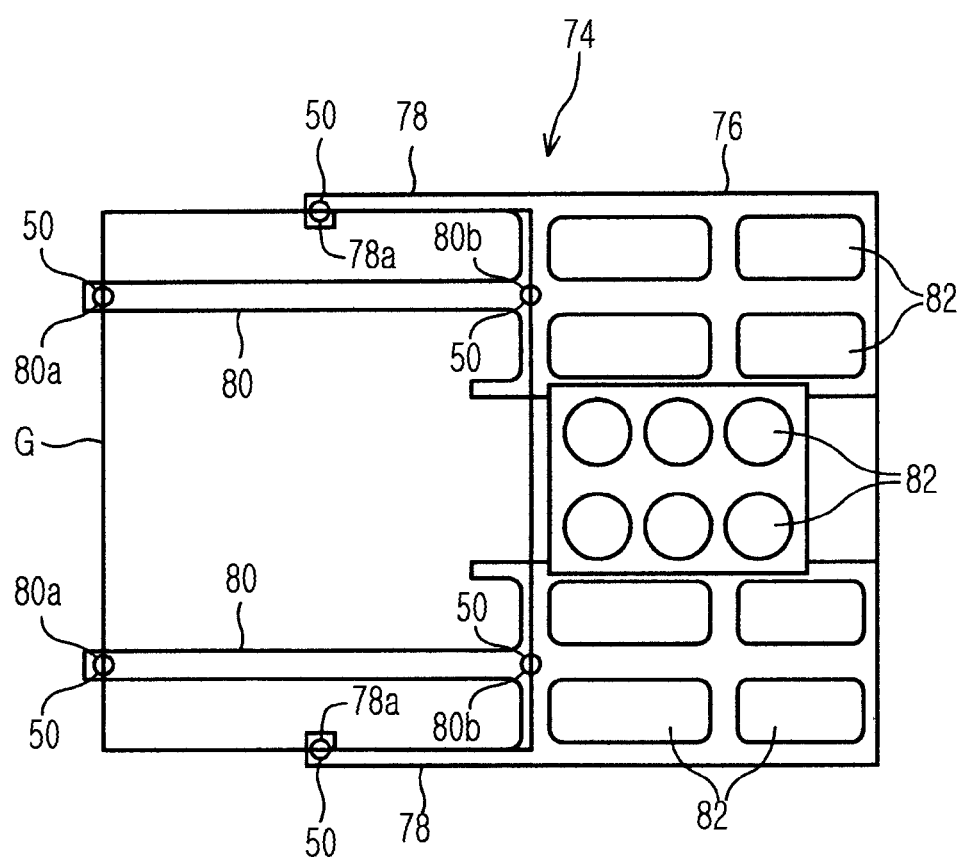
FIG. 17 is a plan view showing an example of adhering a substrate holder according to an embodiment to a transfer arm for transferring a rectangular substrate for FPD.

The transfer arm 74 of FIG. 17 includes a pair of outer support portion 78 and a pair of inner support portion 80 extending forward in parallel from an arm body 76. Here, a claw portion 78a protruding inward to hold a periphery portion on right and left sides of a rectangular substrate G for FPD is formed at a leading end of the outer support portion 78 that is relatively short, where the substrate holder 50 is attached to a top surface of the claw portion 78a. Also, leading end portion 80a of the inner support portion 80 that is relatively long sticks out a little than a front periphery portion of the rectangular substrate G, and thus the substrate holder 50 is also attached to the leading end portion 80a. Also, a base portion 80b of the inner support portion 80 sticks out a little than a rear periphery portion of the rectangular substrate G, and thus the substrate holder 50 is also attached to the base portion 80b. Also, rectangular or circular openings 82 provided in places on the arm body 76 are holes for a light weight.

As such, by attaching the substrate holder 50 to the transfer arm 74, the substrate transfer apparatus for FPD can arbitrarily and freely select an arm position, an arm moving trajectory, and a transfer speed when the transfer arm 74 holds and transfers the rectangular substrate G, without being restricted by the substrate holding portion, and thus transfer capability can be improved. Also, since the transfer capability of the substrate transfer apparatus is improved, throughput of the substrate processing apparatus for FPD or the multi single type inline process system is improved.

Also, according to the substrate transfer apparatus of the present invention, substrate holders attached to a transfer arm do not all have to be the substrate holder of the present invention, and a conventional substrate holder and the substrate holder of the present invention may be used together. Accordingly, for example, in the transfer arm 12 (14) of FIG. 2 or the transfer arm 74 of FIG. 17, only a substrate holder attached to an arm leading end portion that easily tilts forward may be the substrate holder of the present invention, and conventional, for example, tapered pad type substrate holders may be used for other substrate holders.

Also, the substrate holder of the present invention is not limited to the transfer arm of the substrate transfer apparatus, and may be applied to a arbitrary transfer body or moving body transferring or moving a substrate or plate shaped body by holding the substrate or plate shaped body. In this case, the substrate or plate shaped body held by the substrate holder of the present invention on the transfer body or moving body is not limited to a horizontal position or a position facing upward, and may have a position where a main or target surface faces downward or a largely tilted position, or extremely, may have a vertical position.

The invention claimed is:

1. A substrate transfer apparatus for holding and transferring a substrate, the apparatus comprising:
    a transfer body having a first top surface;
    a plurality of substrate holders disposed on the first top surface so as to support a peripheral area of the substrate,
    wherein at least one of the substrate holder comprises a pad main body having a second top surface, and a plurality of protruding portions upwardly extending from the second top surface, the protruding portions being elastically transformable in such a way that, when a substrate rests thereon, the substrate can be sunk down by the gravity thereof, and
    wherein a portion of the protruding portions of each substrate holder contacts the peripheral area of the substrate, which is sunk down by the gravity of the substrate and a portion of a remaining portion of the protruding portions of each substrate holder is not elastically deformed and supports a side surface of the sunk-down substrate, thereby allowing the substrate to be held by the substrate holder when the substrate is misaligned or tilted, and preventing the substrate from escaping from the apparatus while the apparatus moves to transfer the substrate.

2. The substrate transfer apparatus of claim 1, wherein each of the protruding portions comprises a spring member and a cap portion covering a top portion of the spring member.

3. The substrate transfer apparatus of claim 2, wherein the cap portion is permitted to displace in a width direction.

4. The substrate transfer apparatus of claim 1, wherein each of the protruding portions is formed in a grass shape.

5. The substrate transfer apparatus of claim 1, wherein the plurality of protruding portions are arranged on a V-shaped line which has a peak facing a center point of the substrate.

6. The substrate transfer apparatus of claim 1, wherein heights of the plurality of protruding portions are equal to or smaller than a thickness of the substrate.

7. The substrate transfer apparatus of claim 1, wherein the transfer body has a recess portion that is formed on the first surface, and the pad main body is attached to an inside of the recess portion.

8. The substrate transfer apparatus of claim 1, wherein a depth in which the substrate sinks due to elastic displacement of the protruding portions is smaller than a thickness of the substrate.

9. The substrate transfer apparatus of claim 1, wherein the pad main body is configured to be detachable from the transfer body.

10. The substrate transfer apparatus of claim 1, wherein the plurality of substrate holders are arranged to only the peripheral area of the substrate.

11. The substrate transfer apparatus of claim 1, wherein the substrate transfer apparatus is used in a decompressed state.

12. The substrate transfer apparatus of claim 1, wherein the substrate transfer apparatus is provided for transferring the substrate under a high temperature process.

* * * * *